(12) United States Patent
Mobley et al.

(10) Patent No.: US 11,289,900 B2
(45) Date of Patent: Mar. 29, 2022

(54) BROKEN CONDUCTOR DETECTOR

(71) Applicant: Schweitzer Engineering Laboratories, Inc., Pullman, WA (US)

(72) Inventors: James Mobley, Moscow, ID (US); Shankar V. Achanta, Pullman, WA (US); Raymond W. Rice, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 278 days.

(21) Appl. No.: 16/576,324

(22) Filed: Sep. 19, 2019

(65) Prior Publication Data

US 2021/0091559 A1     Mar. 25, 2021

(51) Int. Cl.
| | |
|---|---|
| *H02H 7/26* | (2006.01) |
| *G01R 31/08* | (2020.01) |
| *H02H 5/10* | (2006.01) |
| *H02H 1/00* | (2006.01) |
| *G01R 31/58* | (2020.01) |

(52) U.S. Cl.
CPC ............. *H02H 7/26* (2013.01); *G01R 31/085* (2013.01); *G01R 31/58* (2020.01); *H02H 1/0061* (2013.01); *H02H 5/10* (2013.01); *H02H 7/261* (2013.01)

(58) Field of Classification Search
CPC ........ G01R 31/085; G01R 31/58; H02H 7/26; H02H 7/261; H02H 1/0061; H02H 5/10
See application file for complete search history.

(56) References Cited

U.S. PATENT DOCUMENTS

| | | |
|---|---|---|
| 3,970,898 A | 7/1976 | Baumann |
| 6,205,867 B1 | 3/2001 | Hayes |
| 8,797,018 B2 | 8/2014 | Watkins |
| 9,562,925 B2 | 2/2017 | Nulty |
| 10,955,455 B2 | 3/2021 | Thompson |
| 2009/0243876 A1 | 10/2009 | Lilien |
| 2012/0029871 A1 | 2/2012 | Spillane |
| 2012/0068717 A1 | 3/2012 | Gong |
| 2013/0205900 A1 | 8/2013 | Nulty |
| 2014/0104738 A1 | 4/2014 | Schweitzer |

(Continued)

FOREIGN PATENT DOCUMENTS

WO       2006050156       5/2006

*Primary Examiner* — Jared Fureman
*Assistant Examiner* — Christopher J Clark
(74) *Attorney, Agent, or Firm* — Jared L. Cherry

(57) ABSTRACT

The present disclosure pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine a plurality of vectors. A processing subsystem may be configured to receive the plurality of vectors from the sensor and to identify when the vector is outside of a range defined by a threshold value. The processing subsystem may determine that the conductor is falling based on the plurality of vectors remaining outside of the threshold for a period of time determined by the timer subsystem. A signal may be transmitted by the communication subsystem to indicate that the conductor is falling.

22 Claims, 5 Drawing Sheets

(56) References Cited

U.S. PATENT DOCUMENTS

| | | | |
|---|---|---|---|
| 2014/0136140 A1* | 5/2014 | Chan | G01P 15/00 |
| | | | 702/141 |
| 2016/0363621 A1 | 12/2016 | Kalokitis | |
| 2017/0350932 A1* | 12/2017 | Wang | G01R 31/58 |
| 2018/0156145 A1 | 6/2018 | Clark | |
| 2018/0233895 A1 | 8/2018 | O'Regan | |
| 2019/0162772 A1 | 5/2019 | Berrabah | |
| 2019/0324074 A1* | 10/2019 | Thompson | H02J 13/00002 |
| 2019/0327124 A1 | 10/2019 | Lai | |

* cited by examiner ically. FIG. 5 illustrates a functional block diagram of a system
BROKEN CONDUCTOR DETECTOR

TECHNICAL FIELD

This disclosure relates to systems and methods for detecting broken electrical conductors in electric power systems. The detection of a falling or fallen power line may be used to execute an appropriate control strategy in response and to facilitate repair of the broken power line.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
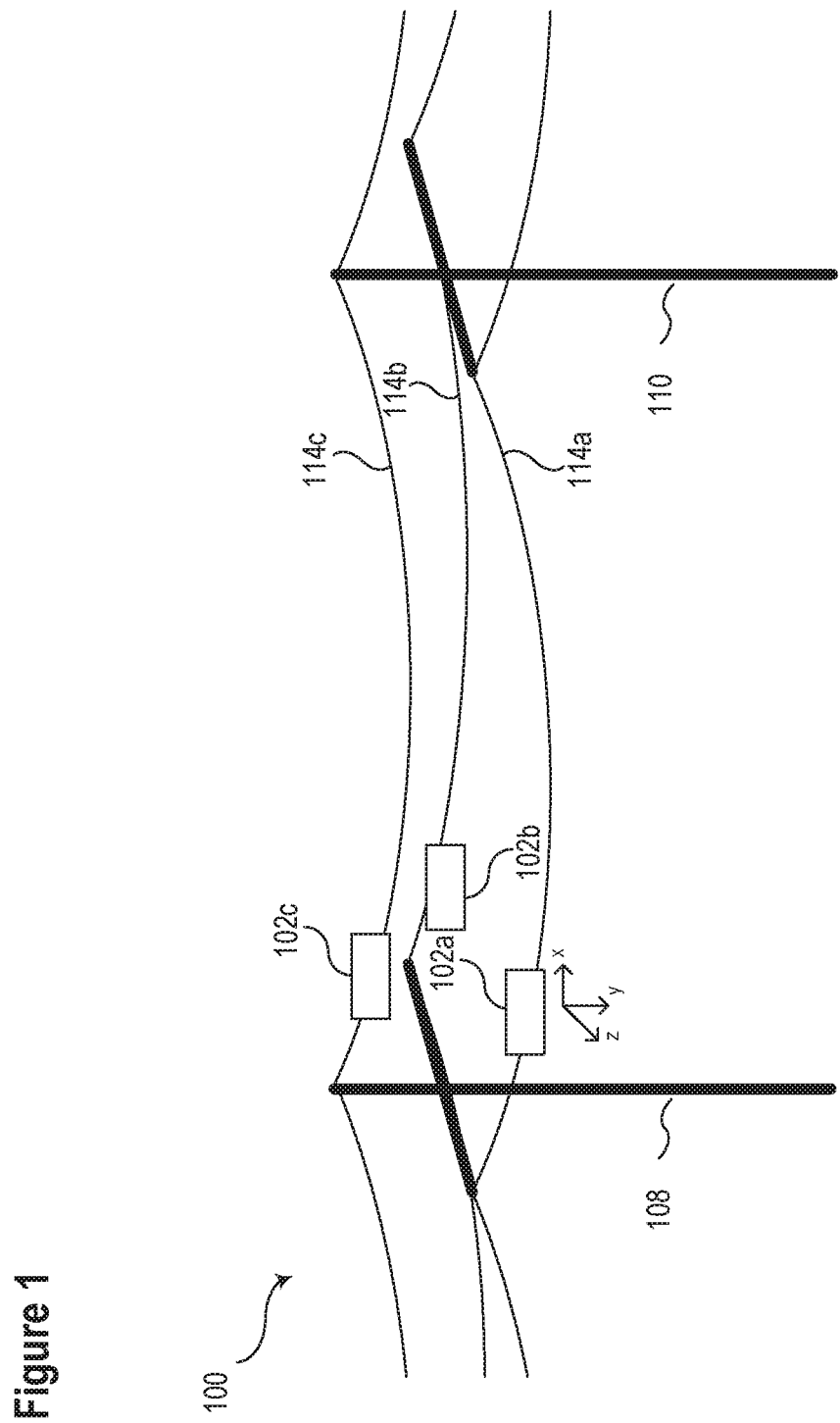
FIG. 1 illustrates a simplified representation of a portion of an electrical distribution system comprising a plurality of conductors suspended from a plurality of pylons and including a plurality of broken conductor detectors consistent with embodiments of the present disclosure.

Electrical power systems may use conductors suspended between pylons to transmit and distribute electrical power. These conductors may be damaged by a wide variety of circumstances ranging from weather, to traffic accidents, to vandalism. Broken electrical conductors may cause fires, present dangers to the public, and disrupt electrical service. Accordingly, the detection of broken electrical conductors may reduce risk to persons and property, and further, may be an important step in repairing the electrical power system.

Systems and methods consistent with the present disclosure may utilize broken conductor detectors. In various embodiments, the broken conductor detectors may be affixed to conductors in an electrical power system in a span near a pylon. Such detectors may monitor the orientation of the device and may determine whether the conductor is broken based on the orientation of the broken conductor detector.

In some embodiments, broken conductor detectors consistent with the present disclosure may communicate wirelessly with a control system. The control system may utilize the information generated by broken conductor detectors to identify an appropriate control strategy in response to the broken conductor. For example, a falling conductor may be de-energized by the control system to reduce the risk of injury to persons and property in the vicinity of the falling conductor.

In some electrical power systems, multiple attempts to reenergize a power line may be made following a trip to address transient conditions (e.g., a fault caused by a temporary gust of wind). In various embodiments consistent with the present disclosure, detection of a falling conductor may disable re-energization systems. Repeated attempts to re-energize a falling conductor may result in electrical arcing, which could cause a fire, or create other types of hazardous conditions.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special-purpose processing devices such as an application specific interface circuit (ASIC), PAL, PLA, PLD, field programmable gate array (FPGA), or any other customizable or programmable device.

Electrical power systems are designed to generate, transmit, and distribute electrical energy to loads. Electrical power systems may include equipment, such as electrical generators, electrical motors, power transformers, power transmission and distribution lines, circuit breakers, switches, buses, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, static VAR compensator (SVC) controllers, on-load tap changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together. The electric power system may be monitored, controlled, automated, and/or protected using IEDs. In general, IEDs in an electric power system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED may refer to any microprocessor-based device that monitors, controls, automates, and/or protects monitored equipment within the electric power system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

In various embodiments, IEDs may be configured to monitor the frequency of alternating current waveforms, voltage levels, or other electrical conditions in the electric power system. A network may be used to transmit information among various components in the electric power system, including IEDs. In various embodiments, the network may be configured to provide streaming measurements that may be analyzed consistent with the present disclosure to detect anomalies.

A common time signal may be used to time-align measurements for comparison and/or to synchronize action across the electric power system. Utilizing a common or universal time source may ensure that IEDs have a synchronized time signal that can be used to generate time-synchronized data, such as synchrophasors. In various embodiments, the common time source may comprise a time signal from a GNSS system. An IED may include a receiver configured to receive the time signal from the GNSS system. In various embodiments, the IED may be configured to distribute the time signal to other components in the electric power system, such as other IEDs.

FIG. 1 illustrates a simplified representation of a portion of an electrical transmission system comprising a plurality of conductors 114a, 114b, and 114c suspended from a plurality of pylons 108 and 110 and including a plurality of broken conductor detectors 102a, 102b, and 102c consistent with embodiments of the present disclosure. Broken conductor detectors 102a-c are affixed to conductors 114a-c and may detect if any of conductors 114a-114c are falling or have fallen. If one or more of conductors 114a-c falls, one or more of broken conductor detectors 102a, 102b, and 102c may transmit a signal to a control system. The control system may implement an appropriate action to deenergize a falling or a fallen conductor and thereby prevent damage to surrounding property or dangerous conditions.

In various embodiments, broken conductor detectors 102a-c may be affixed to conductors 114a-c, respectively, near pylon 108. Affixing the broken conductor detectors 102a-c near pylon 108 may reduce movement caused by wind, and thus reduce the possibility of such movement being misinterpreted as a broken conductor. In some embodiments, the broken conductor detectors 102a-c may be affixed to conductors 114a-c at a distance that is less than the height of the pylon 108. In such embodiments, if conductor 114a breaks anywhere between broken conductor detector 102a and pylon 110, broken conductor detector 102a will be suspended from the portion of conductor 114a attached to pylon 108. As such, the orientation of the broken conductor detector 102a will change from the orientation illustrated in FIG. 1, in which broken conductor detector 102a is substantially parallel to the ground, to an orientation in which broken conductor detector 102a is substantially perpendicular to the ground. In another specific embodiment, the broken conductor detectors 102a-c may be mounted to the conductors 114a-c within a few feet from the pylon 108. Of course, in other embodiments may be mounted at varying distances from pylon 108 and from pylon 110.

Broken conductor detectors 102a-c may include an orientation subsystem to determine an orientation of the broken conductor detectors. In various embodiments, the orientation subsystem may determine a rest vector. The rest vector may be determined at the time of commissioning or at another time when the broken conductor detectors 102a-c are at rest. The rest vector may represent a steady state condition in which the conductor is suspended by pylons 108 and 110. The rest vector may be used for comparison to a current condition to determine if a conductor is broken. In one specific embodiment, the orientation subsystem may determine a first orientation in three axes of the broken conductor detector 102a at a first time and a second orientation in three axes of the broken conductor detector 102a at a second time. The broken conductor detector 102a may monitor acceleration and/or orientation to detect a change in acceleration and/or orientation between the first time and the second time. For example, the broken conductor detector 102a may detect a change in acceleration and/or orientation if a car hits pylon 110. An orientation subsystem may monitor acceleration and/or orientation in one dimension. In some embodiments, the broken conductor detector 102a may monitor acceleration and/or orientation in three dimensions. In other embodiments, the broken conductor detector 102a may monitor acceleration and/or position in two dimensions.

A broken conductor detector may also include an electrical monitoring subsystem to obtain information about electricity flowing through conductors 114a-c. Information from the electrical monitoring subsystem may be used in conjunction with information from the orientation subsystem to determine if a conductor is broken. For example, when a conductor breaks, the current may decrease if the circuit becomes open or may spike if the circuit is shorted. Broken conductor detectors 102a-c may monitor such electrical activity and use position information from the position subsystem and information about the flow of electricity from the electrical monitoring subsystem to detect a change related to the conductors 114a-c.

In some embodiments, each broken conductor detector 102a-c may include a processing subsystem to analyze information from the orientation subsystem and/or the electrical monitoring subsystem. In some embodiments, the processing subsystem may represent the orientation of the broken conductor detector as a plurality of vectors. Further, the processing subsystem may determine a change in the orientation by comparing a first plurality of position vectors from at a first time to a second plurality of position vectors at a second time. For example, if the conductor 114a falls from pylon 108, the processing subsystem of broken conductor detector 102a may detect a change in orientation and may compare the position vectors from a time at which the broken conductor detector was at rest to the current position vectors. In one specific embodiment, the vectors may be summed and compared to a threshold. If the sum of the vectors satisfies the threshold, the broken conductor detector 102a-c may transmit a signal indicating that an associated conductor is broken and that the broken conductor detector is broken.

When conductors 114a-c are at rest, two conditions may be evaluated by broken conductor detectors 102a-c. First, the magnitude of the sum of the accelerations of all three axes will be approximately equal to the force of gravity (i.e., 1 g) when the broken conductor detectors 102a-c are at rest. Second, the acceleration in the direction parallel to the conductor 114a-c is approximately zero when the broken conductor detectors 102a-c are at rest. Broken conductor detectors 102a-c may evaluate either or both of these conditions to determine if a conductor is broken. In one embodiment, the broken conductor detector 102a may determine that the conductor 114a is falling when the processing subsystem detects that the sum of the plurality of vectors is not approximately equal to the force of gravity for at least a specified duration of time.

In one embodiment, a representation of the orientation of a broken conductor detector 102a-c may be defined such that one axis is substantially parallel to the conductor 114a-c on which the broken conductor detector 102a-c is mounted or the ground below the conductor 114a-c. In the illustrated embodiment, the x-axis of broken conductor detector 102a is oriented substantially parallel to conductor 114a, which may also be substantially parallel to the ground. Broken conductor detector 102a may monitor acceleration in one or more directions to determine whether conductor 114a is broken. In one specific embodiment, broken conductor detector 102a determines that the conductor 114a is falling by detecting an acceleration in the direction substantially parallel to the conductor 114a. The acceleration is set forth in Equation 1.

$$x \text{ axis acceleration} = \sin(\text{degrees from parallel with ground}) \quad \text{Eq. 1}$$

If the angle from parallel with the ground is 30°, broken conductor detector 102a may experience a force of 0.5 g. In one embodiment, a threshold of 0.5 g may be used to differentiate a break in conductor 114a from a transitory condition.

In some embodiments, the broken conductor detector 102a may determine the conductor 114a is falling when the processing subsystem detects the vector in one axis is not within the threshold for a period of time. In some embodiments, the processing subsystem determines the conductor 114a is falling when the vector associated with the x-axis is not approximately within 0 for a period of time. In some embodiments, the period of time utilized to determine if the conductor 114a is falling may be called a time threshold. In instances where the conductor 114a is determined to be falling or to have fallen, the processing subsystem may generate a signal.

The broken conductor detector 102a may include a broken conductor detector communication subsystem. The broken conductor detector communication subsystem may include one or more antennas. The orientation of an antenna associated with the broken conductor detector 114a affects how far the device can transmit a signal; however, the orientation of an antenna may change when conductor 114a breaks. To address this issue, various embodiments of broken conductor detectors consistent with the present disclosure may include a plurality of antennas, each of which may be positioned to maximize the distance a message may be transmitted in different orientations. In some specific embodiments, a broken conductor detector may include two antennas that are oriented such that one antenna is polarized for a maximum transmission distance when the power line is approximately parallel to ground, and the other is polarized for a maximum transmission distance when the power line is perpendicular to the ground. In this embodiment, a broken conductor detector may selectively activate the antenna that is best suited to the device's orientation, as determined by the orientation subsystem.

A variety of communication technologies may be used to transmit signals from broken conductor detectors 102a-c to other devices. In some embodiments a radio-frequency transmitter may be used. Radio-frequency transmitters offer simple, inexpensive, low power, and fast transmission; however, the range of such transmitters is limited by available power and topography. In other embodiments, signals may be transmitted via a cellular network. Such embodiments may take advantage of the fact that cellular service is widely available; however, such systems may have higher cost, higher power consumption, and increased latency over radio frequency transmission. In still other embodiments, signals may be carried over wired networks.

In various embodiments consistent with the present disclosure, broken conductor detector 102a may include a time subsystem that may be used to measure the duration of changes in the orientation subsystem. Conductor 114a may be subject to environmental factors (e.g., wind) that may cause the conductor 114a to move without falling. The timer subsystem may be used to determine the period of time during which changes persist in the orientation and/or acceleration. In some embodiments, the period of time during which the changes are detected may be used to differentiate between transient conditions (e.g., a strong wind gust) and permanent conditions (e.g., a fallen conductor).

In various embodiments consistent with the present disclosure, broken conductor detector 102 may include a unique identifier that may be used in connection with a location subsystem to associate each broken conductor detector 102 with a specific location in the electric power system. The unique identifier may be transmitted to a control system and used to allow a technician and/or another user to locate the broken conductor.

Upon detection of a falling or a fallen conductor, an IED or other control element may interrupt the flow of electricity through the broken conductor. The IED may be in communication with a plurality of fallen conductor detectors and may implement a protective action in response to a signal indicative of a falling or a fallen conductor. Interrupting the flow of the electric power through the broken conductor may decrease the possible and/or actual harm to people, animals, nature, structures, and other surroundings. The IED may further send a notification to the user to inform the user when the conductor is broken, and allowing the user to repair the broken conductor. In some embodiments, the IED may record electrical parameters of the electric power system (e.g., peak current) at or near the time that the conductor breaks.

Figure 2:
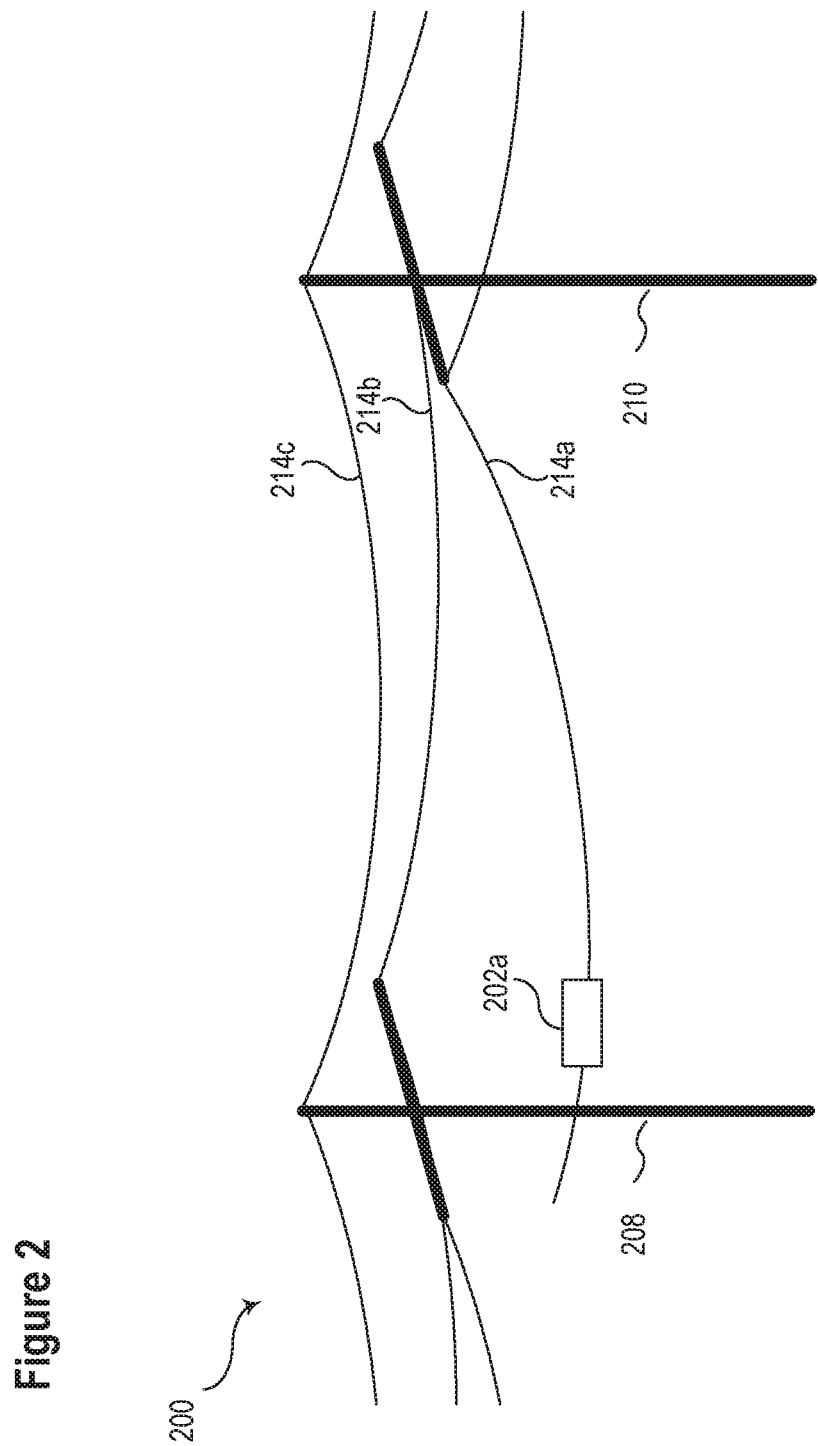
FIG. 2 illustrates a simplified representation of a portion of an electrical distribution system in which a broken conductor detector associated with a conductor is in a free-fall condition due to a broken conductor consistent with embodiments of the present disclosure.

FIG. 2 illustrates a simplified representation of a portion of an electrical distribution system 200 in which a broken conductor detector 202a associated with a conductor 214a is in a free-fall condition consistent with embodiments of the present disclosure. In the illustrated embodiment, a conductor 214a is strung between pylon 208 and pylon 210. When conductors break, the break typically occurs in proximity to a pylon. If the line breaks at the power pole nearest to the broken conductor detector, the broken conductor detector may detect a free-fall condition, as shown in FIG. 2. If the line breaks at the power pole farthest from the broken conductor detector, the broken conductor detector may detect that the line is no longer parallel to the ground, as described in greater detail in connection with FIG. 3. When the broken conductor detector detects either of these two conditions, it may transmit a message to indicate a falling or a fallen conductor.

Various criteria may be used to determine when conductor 214a is in a free-fall condition. In one specific embodiment, the broken conductor detector 202a may determine a sum of a plurality of vectors in each of three perpendicular axes. The sum of the plurality of vectors may be compared to a threshold. If the broken conductor detector 202a determines difference in the sum of the plurality of vectors is no longer within the threshold, the broken conductor detector 202a may determine the conductor 214a is in a free-fall condition. In some embodiments, the threshold value may be approximately equal to the force of gravity. For example, a threshold value of 0.5 g may correspond to the device being in a free-fall condition.

In various embodiments consistent with the present disclosure, broken conductor detector 202a may include a timer that may be used to detect the transient condition. Conductor 214a may be subject to environmental factors (e.g., wind) that may cause the conductor 214a to move without falling. The timer may be used to determine the period of time during which changes persist. In some embodiments, the period of time during which the changes are detected may be used to differentiate between transient conditions (e.g., a strong wind gust) and permanent conditions (e.g., a broken conductor).

Figure 3:
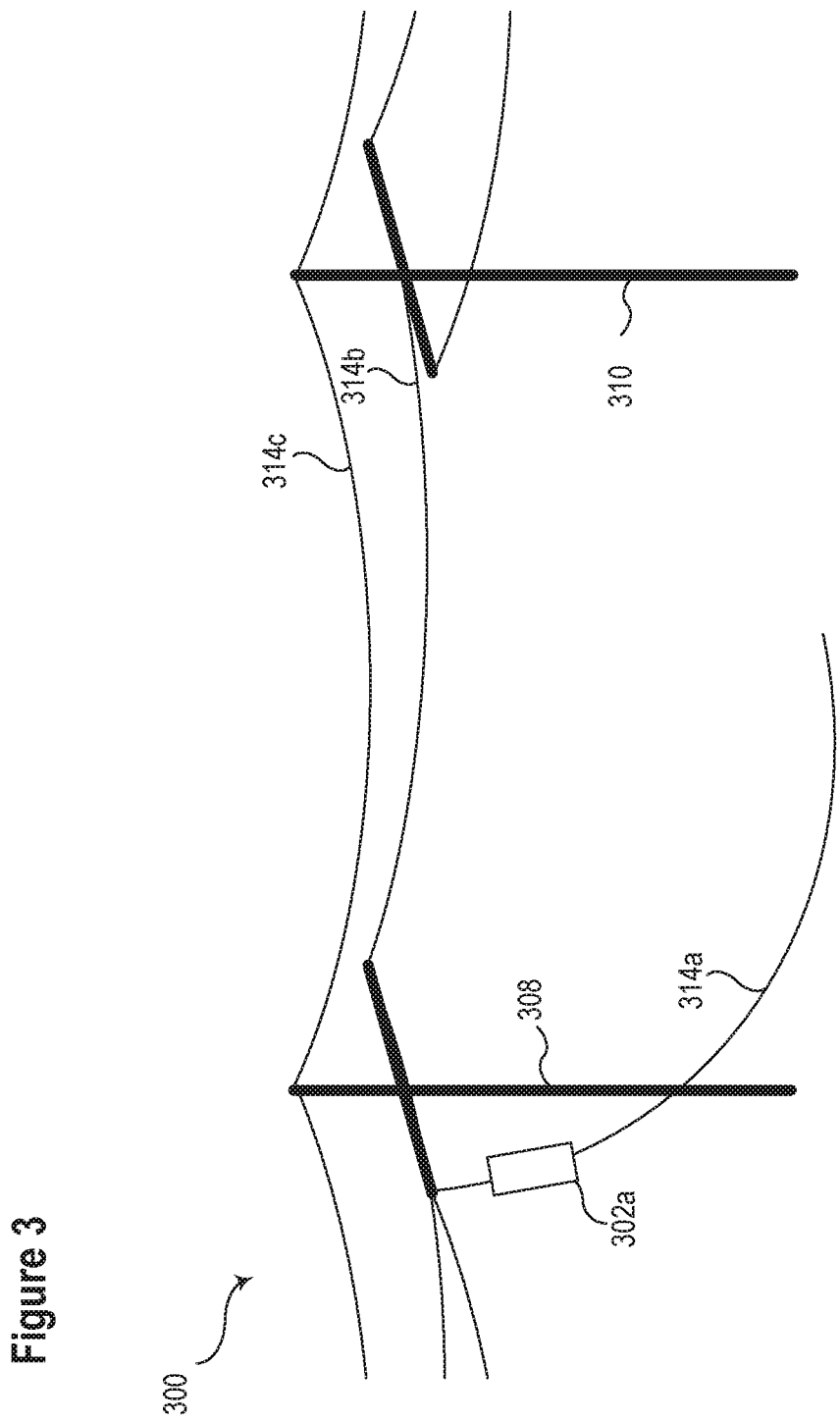
FIG. 3 illustrates a simplified representation of a portion of an electrical distribution system in which an orientation of a broken conductor detector is indicative of break in a conductor to which the detector is mounted consistent with embodiments of the present disclosure.

FIG. 3 illustrates a simplified representation of a portion of an electrical distribution system 300 in which an orientation of a broken conductor detector 302a is indicative of break in a conductor 314a to which the detector is mounted consistent with embodiments of the present disclosure. In the illustrated embodiment, the conductor 314a is strung between pylon 308 and pylon 310. Broken conductor detector 302a is affixed to conductor 314a near pylon 308. In the illustrated embodiment, broken conductor detector 302a is affixed to conductor 314a at a distance that is less than the height of the pylon 308, allowing broken conductor detector 302a to detect a change in its orientation without hitting the ground.

In the illustrated embodiment, broken conductor detector 302a may detect a break in conductor 314a near pylon 310 based on the orientation of broken conductor detector 302a. As may be appreciated by comparing the orientation of broken conductor detector 102a in FIG. 1 to the orientation of broken conductor detector 302a in FIG. 3, the break in conductor 314a causes a change in the orientation of broken conductor detector 302a because the broken conductor detector 314a is hanging from pylon 308.

A sensor subsystem in broken conductor detector 302a may determine that the orientation of broken conductor detector 302a is indicative of break in the conductor 314a to which the detector is mounted. Various embodiments of a sensor subsystem may be utilized to make such a determination. In one specific embodiment, a two-dimensional rotation sensor may be utilized. While the conductor 314a remains suspended between pylon 308 and 310, the orientation of the broken conductor detector 302a may be substantially parallel to the ground below the conductor 314a. Upon a break of the conductor 314a, the orientation of broken conductor detector 302a changes from being oriented substantially parallel to the ground to being substantially perpendicular to the ground. In such a transition, a rotation sensor may detect the change in orientation. Such a change may cause broken conductor detector 302a to generate a signal indicating that conductor 314a is broken.

In another specific embodiment, accelerometers may be used to detect a change in the orientation of broken conductor detector 302a. Accelerometers may monitor acceleration in one or more directions to determine whether conductor 314a is broken. In one specific embodiment, broken conductor detector 302a may determine that the conductor 314a is falling by detecting an acceleration toward the ground caused by gravity.

Broken conductor detector 302a may use a plurality of antennas oriented to facilitate transmission of a signal in multiple orientations. The plurality of antennas may be disposed in different orientations to improve transmission of the signal in various orientations of broken conductor detector 302a. In one embodiment, a first antenna may be configured to transmit a signal in the expected orientation of broken conductor detector 302a when conductor 314a is not broken, and a second antenna may be configured to transmit the signal in the expected orientation of broken conductor detector 302a when conductor 314a is broken. Further, in some embodiments, a communication subsystem may selectively activate different antennas based on a detected orientation of broken conductor detector 302a. For example, a first antenna may be used to communicate when broken conductor detector 302a is oriented substantially parallel to the ground, and a second antenna may be used to communicate when broken conductor detector 302a is oriented substantially perpendicular to the ground, as illustrated in FIG. 3.

When the conductor 314b is falling or fallen the broken conductor detector 302a may detect the vector is not within the threshold indicating there may be a change in the acceleration of at least one axis of the broken conductor detector 304. In some embodiments, if the broken conductor detector 304 determines the acceleration of the x-axis vector is no longer within the threshold, the broken conductor detector 304 may determine the conductor 314b is broken. In some embodiments, the value of the x-axis vector may be approximately 0 g at rest. In some embodiments, the broken conductor detector 304 may record the peak current of the conductor 314b and any other relevant information.

In various embodiments consistent with the present disclosure, broken conductor detector 304 may include a timer that may be used to detect the transient condition. Conductor 314b may be subject to environmental factors (e.g., wind) that may cause the conductor 314b to move without falling. The timer may be used to determine the period of time during which changes persist. In some embodiments, the period of time during which the changes are detected may be used to differentiate between transient conditions (e.g., a strong wind gust) and permanent conditions (e.g., a falling conductor). In various embodiments consistent with the present disclosure, broken conductor detector 304 may include a location subsystem to associate each broken conductor detector 304 with a location in the electric power system. The location subsystem may be utilized to allow a technician or another user to locate the broken conductor 314b.

Such equipment may be monitored, controlled, automated, and/or protected using IEDs that receive electric power system information from the equipment, make decisions based on the information, and provide monitoring, control, protection, and/or automation outputs to the equipment. The term IED may be used to describe an individual IED or a system comprising multiple IEDs. A network may be used to transmit information among various components in the electric power system, including IEDs. In various embodiments, the network may be configured to provide streaming measurements that may be analyzed consistent with the present disclosure to detect anomalies. In general, IEDs in an electric power system may be used for protection, control, automation, and/or monitoring of equipment in the system. For example, IEDs may be used to monitor equipment of many types, including conductors 314a-c and broken conductor detector 302a.

The IED may receive the signal from the communication subsystem of the broken conductor detector 304. This signal may indicate that the conductor 314b is broken. The IED may further comprise a protective action subsystem to issue a command to interrupt the flow of the electric power through the conductor 314b based on the signal. Interrupting the flow of the electric power through the conductor 314b may decrease the possible and/or actual harm to people, animals, nature, structures, and other surroundings. The IED may send a notification to the user to inform the user of the broken conductor 314a.

Figure 4:
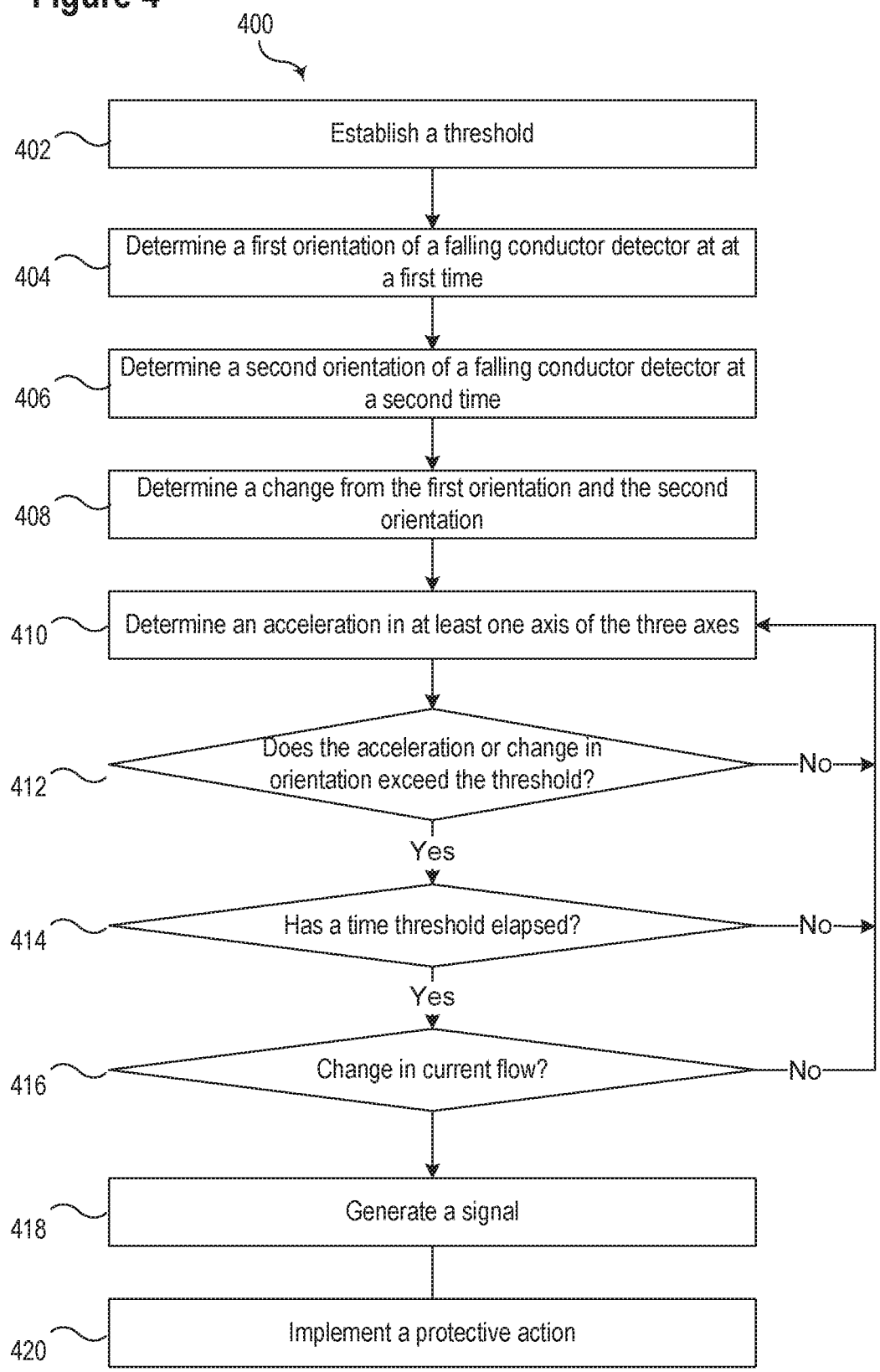
FIG. 4 illustrates a flow chart of a method for detecting a broken conductor consistent with embodiments of the present disclosure.

FIG. 4 illustrates a flow chart of a method 400 for detecting a broken conductor consistent with embodiments of the present disclosure. At 402, a threshold may be established. In various embodiments, the threshold may be a static value, while in other embodiments, the threshold may vary over time or based on conditions. In some embodiments, the threshold may represent acceleration and/or orientation of the broken conductor detector.

At 404, a first orientation of a broken conductor detector at a first time may be determined. The first orientation may be determined in three axes by a sensor subsystem. In some embodiments, the first orientation may be represented in vectors. At 406, a second orientation of the broken conductor detector at a second time may be determined. The second orientation may be determined in three axes by the sensor subsystem. In some embodiments, the second orientation may be represented by vectors. At 408, the processing subsystem may determine a change from the first orientation and the second orientation.

At 410, the processing subsystem may determine an acceleration in at least one axis of the three axes based on the change. Determining the acceleration may indicate that the broken conductor detector is falling. At 412, the processing subsystem determines if the acceleration or change in orientation exceeds the threshold. If the acceleration does not exceed the threshold, the method 400 may return to 408. If the acceleration exceeds the threshold, method 400 may proceed to 414.

At 414, method 400 may determine whether a time threshold has elapsed. In some embodiments, a start time may be initialized when method 400 reaches 412, and the start time may be compared to a time threshold. In one specific embodiment, the time threshold may be implemented using a timer. The time threshold may be associated with the timer configured to require that a detected acceleration and/or change in acceleration be maintained for a period of time. The time threshold may be selected to differentiate between transient conditions (e.g., strong wind gusts) and permanent conditions (e.g., a falling conductor). In some embodiments, the threshold and time threshold may be determined by recording data during normal operation for a set time period. The data used to determine the threshold and time threshold may be recorded during the commissioning of the device. Of course, the data used to determine the threshold and time threshold may also be generated after commissioning and/or the threshold and/or time threshold may be adjusted during the life of the device to improve the performance of the broken conductor detector and reduce the likelihood of false detections. If the time threshold has not elapsed, method 400 may return to 408. If the time threshold has elapsed, the method may proceed to 416.

At 416, method 400 may determine whether there has been a change in current flow. For example, if the conductor is broken, the circuit may be open, and as such, the current may fall to near zero. Monitoring the current flowing through the conductor may add security to the system to guard against unnecessary protective actions. In one specific embodiment, a peak current may be recorded and transmitted along with any signal related to a broken conductor. In one specific embodiment, the power consumption associated with an electrical monitoring system may be minimized by capturing a short (e.g., a few seconds), relatively low-resolution (e.g., 8 bits), low sample rate (e.g., 12 samples/ second) signal. In various embodiments, periodic current measurements may be transmitted to allow for improved monitoring of the electrical system. Such information may be used to monitor consumption, plan for upgrades, and/or make control decisions, such as load shedding, when required. If there has been no change in current flow, the method 400 may return to 408. If there has been a change in current flow, method 400 may proceed to 418.

At 418, a signal may be generated to indicate that a broken conductor has been detected. In some embodiments, the signal may include additional information related to electrical conditions and/or the location of the fallen conductor detector transmitting the signal. Such information may be used to determine an appropriate protective action and facilitate repair.

A protective action may be implemented at 420 based on the signal from the broken conductor detector. The IED may issue a command via the protective action subsystem to interrupt the flow of electric power through the conductor based on the signal. In various embodiments, the protective action may comprise tripping a current-interrupting device to de-energize the falling conductor.

Figure 5:
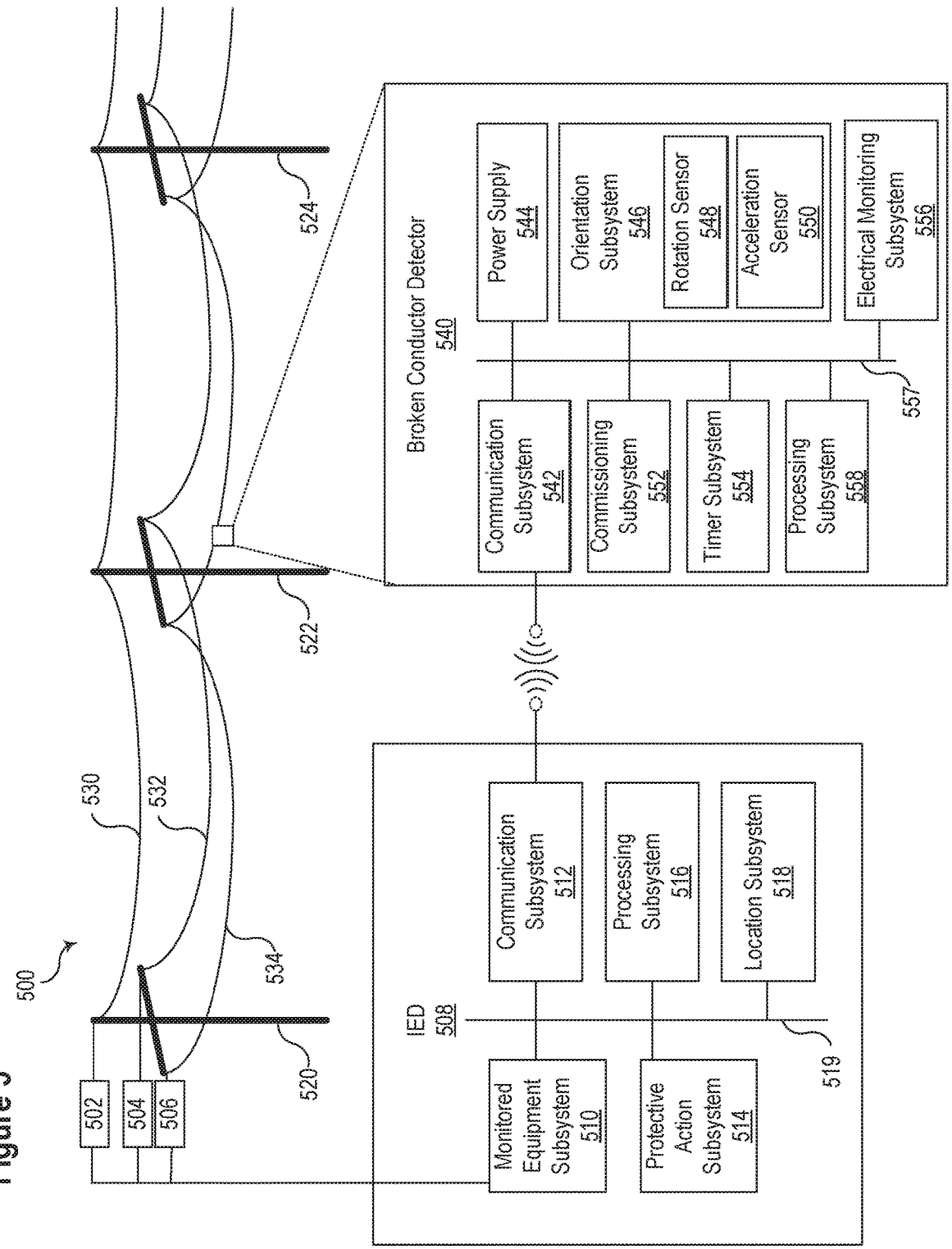
FIG. 5 illustrates a functional block diagram of a system comprising a broken conductor detector consistent with embodiments of the present disclosure.

FIG. 5 illustrates a functional block diagram of an electrical power system 500 comprising a broken conductor detector 540 consistent with embodiments of the present disclosure. System 500 may be implemented using hardware, software, firmware, and/or any combination thereof. In the illustrated embodiment, system 500 comprises an intelligent electronic device (IED) 508, while in other embodiments, certain components or functions described herein may be associated with other devices or performed by other devices. The specifically illustrated configuration is merely representative of one embodiment consistent with the present disclosure.

System 500 comprises conductors 530, 532, and 534, which are configured to transmit three-phase power. The conductors 530, 532, and 534 span pylons 520, 522, and 524. Current interrupting devices 502, 504, and 506 may be in electrical communication with the conductors 530, 532, and 534, respectively. In various embodiments, current-interrupting devices may comprise reclosers, circuit breakers and the like.

IED 508 may be configured to monitor conductors 530, 532, and 534, and to implement protective actions to ensure the safe transmission of electrical power. In various embodiments, IED 508 may receive information relating to electrical conditions (e.g., current measurements, etc.) associated with conductors 530, 532, and 534. In addition, IED 508 may be in communication with the broken conductor detector 540. IED 508 may implement protective action based on electrical conditions and/or falling of conductor 534. The single broken conductor detector 540 is shown on a single span of a single conductor 534 for purposes of simplicity in the illustrated embodiment. In other embodiments, a plurality of broken conductor detectors 540 may be placed on multiple spans near pylons 520, 522, and 524.

IED 508 may include a monitored equipment subsystem 510, a communication subsystem 512, a protective action subsystem 514, a processing subsystem 516, and a location subsystem 518. A bus 519 may connect the internal elements of IED 508. The monitored equipment subsystem 510 may be configured to issue commands to and/or receive status information from current-interrupting devices 502, 504, and 506. Communication subsystem 512 may be configured to receive information from broken conductor detector 540. In the illustrated embodiment, the communication subsystem 512 may be configured to receive a wireless signal from broken conductor detector 540. In various embodiments, the signal may be transmitted using a radio-frequency signal. In various embodiments, communication subsystem 512 may also permit communication between IED 508 and other devices (not shown) associated with an electrical power system in electrical communication with conductors 530, 532, and 534.

The processing subsystem 516 may be configured to process information received from monitored equipment subsystem 510 and communication subsystem 512. Processing subsystem 516 may operate using any number of processing rates and architectures. Processing subsystem 516 may be configured to perform various algorithms and calculations described herein. Processing subsystem 516 may be embodied as a general-purpose integrated circuit, an application-specific integrated circuit, a field-programmable gate array, and/or any other suitable programmable logic device.

The protective action subsystem 514 may be configured to implement an appropriate protective action based on information from monitored equipment subsystem 510 and communication subsystem 512. For example, protective action subsystem 514 may be configured to interrupt the flow of electrical current through conductors 530, 532, and 534 based on the signal from broken conductor detector 540 that conductor 534 is falling and/or fallen. Upon receipt of a signal that a conductor is broken, protective action subsystem 514 may cause monitored equipment interface 510 to interrupt the flow of electrical current through conductors 530, 532, and 534. In some embodiments, current interrupting devices 502, 504, and 506 may be actuated by the protective action subsystem 514. In other embodiments, the protective action subsystem 514 may block or suppress automatic reclosing of current-interrupting devices 502, 504, and 506.

The location subsystem 518 may be configured to associate the broken conductor detector 540 with a particular location. In the illustrated embodiment, only the single broken conductor detector 540 is illustrated for simplicity; however, in other embodiments, a large number of broken conductor detectors 540 may be placed throughout an electric power system. A location subsystem 518 may be configured to associate each broken conductor detector 540 with a specific location. Identifying the location of a broken conductor is the first step in repairing the conductor. Accordingly, location subsystem 518 may help to increase the efficiency of locating and repairing a broken conductor. In various embodiments, a unique identifier may be associated with each broken conductor detector 540, and the location of each detector 540 may be recorded by location subsystem 518. A broken conductor detector 540 may transmit its unique identifier to allow for the location of the signal to be identified.

Broken conductor detector 540 may include a communication subsystem 542, a power supply 544, an orientation subsystem 546, a commissioning subsystem 552, a timer subsystem 554, and a processing subsystem 558. A bus 557 may connect the internal elements of broken conductor detector 540. The communication subsystem 542 may be configured to provide a signal as conductor 534 falls. In some embodiments, communication subsystem 542 may be configured to generate a periodic indication of a status (e.g., a heartbeat signal) of the falling conductor to provide an indication to IED 508 that broken conductor detector 540 continues to function.

The power supply 544 may be configured to provide power to broken conductor detector 540. In some embodiments, power supply 544 may be configured to draw power from conductor 534. In some embodiments, power supply 544 may utilize a current transformer to harvest energy from conductor 534. Power supply 544 may further incorporate a power storage device that may used to transmit information when current is not flowing through conductor 534 and power cannot be harvested. A power storage device may be embodied as a battery, a supercapacitor, and the like.

The orientation subsystem 546 may be configured to detect breakage of conductor 534. In the illustrated embodiment, orientation subsystem 546 comprises a rotational position sensor 548 and an acceleration sensor 550. In other embodiments, orientation subsystem 546 may comprise only one type of sensor (e.g., either a rotational position sensor or an acceleration sensor). The orientation subsystem 546 may be configured to determine a plurality of vectors reflecting the current orientation and/or acceleration of broken conductor detector 540. The plurality of vectors may be analyzed to determine whether conductor 534 has broken and/or whether the broken conductor detector 540 is falling or has fallen.

The commissioning subsystem 552 may be configured to determine a threshold that may be compared to the plurality of vectors to determine if the broken conductor detector 540 is operating within established parameters. In some embodiments, the commissioning subsystem 552 is configured to permit a user to establish various thresholds that may be used, along with measurements from orientation subsystem 546, to determine when conductor 534 is falling and/or fallen.

A timer subsystem 554 may be configured to determine if deviations of the plurality of vectors are transitory or whether the deviations persist for a sufficient duration to indicate that conductor 534 is broken.

The processing subsystem 558 may be configured to utilize information from orientation subsystem 546, commissioning subsystem 552, and timer subsystem 554 to determine whether conductor 534 is falling and/or fallen. The processing subsystem 558 may generate a signal to be transmitted to IED 508 by the communication subsystem 542 indicating that conductor 534 is broken.

An electrical monitoring subsystem 556 may monitor electrical parameters of current flowing through conductor 534. In various embodiments, electrical monitoring subsystem 556 may monitor the current flowing through conductor 534. Electrical monitoring subsystem 556 may determine a change in electrical current before a signal is generated that conductor 534 is broken. For example, the change may comprise an increase in current or a decrease in current. The current may decrease as a result of a broken conductor when the break results in an open circuit. Further, the break may cause an increase in current when the break results in a lower-impedance path to ground. Such conductions may occur, for example, when a tree or other object falls on the line and provides a lower-impedance path to ground.

While specific embodiments and applications of the disclosure have been illustrated and described, it is to be understood that the disclosure is not limited to the specific configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system configured to detect a falling conductor in an electric power system, the system comprising:
   a broken conductor detector to couple to an electrical conductor, comprising:
      an orientation subsystem to determine:
         a first orientation in three axes of the broken conductor detector at a first time; and
         a second orientation in three axes of the broken conductor detector at a second time;
      a processing subsystem in communication with the orientation subsystem, the processing subsystem to:
         receive the first orientation in three axes and the second orientation in three axes;
         determine an acceleration in at least one axis of the three axes based on the first orientation and the second orientation;
         determine that the acceleration exceeds a threshold; and
         generate a signal based on the acceleration exceeding the threshold; and
      a broken conductor detector communication subsystem to transmit the signal; and
   an intelligent electronic device (IED), comprising:
      an IED communication subsystem configured to receive the signal; and
      a protective action subsystem configured to issue a command to interrupt the flow of electric power through the conductor based on the signal.

2. The system of claim 1, wherein the processing system represents the first orientation and the second orientation as a plurality of vectors.

3. The system of claim 2, wherein the processing system generates a sum of the plurality of vectors and compares the sum of the plurality of vectors to the threshold.

4. The system of claim 2, wherein the sum of the plurality of vectors is approximately equal to a force of gravity when the broken conductor detector is at rest.

5. The system of claim 1, wherein the broken conductor detector is to be mounted to the line in proximity to a pylon.

6. The system of claim 4 wherein the distance from the broken conductor detector to the pylon is less than a height of the pylon.

7. The system of claim 1, wherein the broken conductor detector communication subsystem comprises a first antenna to facilitate communication in the first orientation and a second antenna to facilitate communication in the second orientation.

8. The broken conductor detector of claim 1, wherein the first orientation comprises a rest vector generated at a time of commissioning.

9. The broken conductor detector of claim 1, wherein the threshold is selected to accommodate expected motion of the broken conductor detector due to wind.

10. The broken conductor detector system of claim 1, further comprising a location subsystem configured to associate each of a plurality of broken conductor detectors with a location in the electric power system.

11. The broken conductor detector system of claim 1, wherein the system detects that the system is in a free-fall condition and transmits the signal before coming to rest.

12. The broken conductor detector system of claim 1, further comprising an electrical monitoring subsystem to detect a change in a current flow through the electrical conductor;
   wherein, the signal is further based on the change in the current flow through the electrical conductor.

13. A method for detecting a falling conductor in an electric power system, the method comprising:
   coupling a broken conductor detector to a conductor;

determining, using a sensor subsystem, a first orientation in three axes of the broken conductor detector at a first time;

determining, using the sensor subsystem, a second orientation in three axes of the broken conductor detector at a second time;

receiving, using a processing subsystem, the first orientation in three axes and the second orientation in three axes;

determining, using the processing subsystem, a change from the first orientation and the second orientation;

determining, using the processing subsystem, an acceleration in at least one axis of the three axes;

determining, using the processing subsystem, that the acceleration exceeds a threshold;

generating, using the processing subsystem, a signal based on the acceleration exceeding the threshold;

transmitting, using a falling conductor detector communication subsystem, the signal;

receiving, using an intelligent electronic device (IED), the signal; and issuing a command to interrupt the flow of the electric power through the conductor based on the signal.

14. The method of claim 13, further comprising representing the first orientation and the second orientation as a plurality of vectors.

15. The method of claim 14, further comprising generating a sum of the plurality of vectors and comparing the sum of the plurality of vectors to the threshold.

16. The method of claim 14, wherein the sum of the plurality of vectors is approximately equal to a force of gravity when the broken conductor detector is at rest.

17. The method of claim 13, wherein the broken conductor detector is to be mounted to the line in proximity to a pylon.

18. The method of claim 17, wherein the distance from the broken conductor detector to the pylon is less than a height of the pylon.

19. The method of claim 13, wherein the broken conductor detector communication subsystem comprises a first antenna to facilitate communication in the first orientation and a second antenna to facilitate communication in a second orientation.

20. The method of claim 13, wherein the threshold is selected to accommodate expected motion of the broken conductor detector due to wind.

21. The method of claim 13, wherein the system detects that the conductor is in free fall and transmits the signal before coming to rest.

22. A system configured to detect a falling conductor in an electric power system, the system comprising:
 a broken conductor detector to couple to an electrical conductor, comprising:
  an orientation subsystem to determine:
   a first orientation in three axes of the broken conductor detector; and
   a second orientation in three axes of the broken conductor detector;
  a processing subsystem in communication with the orientation subsystem, the processing subsystem to:
   receive the first orientation in three axes and the second orientation in three axes;
   determine a change from the first orientation and the second orientation;
   determine that the change exceeds a threshold; and
   generate a signal based on the change exceeding the threshold; and
  a broken conductor detector communication subsystem to transmit the signal; and
 an intelligent electronic device (IED), comprising:
  an IED communication subsystem configured to receive the signal; and
  a protective action subsystem configured to issue a command to interrupt the flow of electric power through the conductor based on the signal.

* * * * *